United States Patent
Lee

(10) Patent No.: US 8,714,523 B2
(45) Date of Patent: May 6, 2014

(54) VALVE FOR VACUUM PROCESS

(76) Inventor: Dong-Min Lee, Cheongju-si (KR)

(*) Notice: Subject to any disclaimer, the term of this patent is extended or adjusted under 35 U.S.C. 154(b) by 342 days.

(21) Appl. No.: 13/246,181

(22) Filed: Sep. 27, 2011

(65) Prior Publication Data

US 2012/0126159 A1 May 24, 2012

(30) Foreign Application Priority Data

Nov. 19, 2010 (KR) .......................... 10-2010-0115483

(51) Int. Cl.
*F16K 31/122* (2006.01)
*F16K 31/126* (2006.01)
*F16J 3/06* (2006.01)

(52) U.S. Cl.
USPC ........................................ 251/335.3; 251/63.6

(58) Field of Classification Search
CPC ........ F16K 51/02; F16K 41/10; F16K 31/122; F16K 31/1221
USPC ................... 251/62, 63, 63.6, 335.3
See application file for complete search history.

(56) References Cited

U.S. PATENT DOCUMENTS

| | | | | |
|---|---|---|---|---|
| 3,315,700 A * | 4/1967 | Greenwood | .................... | 137/375 |
| 3,573,863 A * | 4/1971 | Doors et al. | .................... | 137/375 |
| 4,040,445 A * | 8/1977 | McCormick | ............. | 137/596.18 |
| 4,232,695 A * | 11/1980 | Roberge | ............................. | 137/1 |
| 4,482,091 A * | 11/1984 | Lawsing | ..................... | 236/92 R |
| 4,991,619 A * | 2/1991 | della Porta | ..................... | 137/240 |
| 5,379,982 A * | 1/1995 | Koyomogi et al. | .............. | 251/77 |
| 5,597,009 A * | 1/1997 | Scherrer et al. | ................ | 137/375 |
| 5,678,595 A * | 10/1997 | Iwabuchi | ....................... | 137/341 |
| 5,881,998 A * | 3/1999 | Brenes | ........................ | 251/335.3 |
| 6,805,152 B2 * | 10/2004 | Kanzaka et al. | .............. | 137/341 |
| 7,481,417 B2 * | 1/2009 | Mayer et al. | ................... | 251/158 |
| 8,196,893 B2 * | 6/2012 | Grout et al. | .................... | 251/63.6 |
| 2003/0178064 A1 * | 9/2003 | Fukuda et al. | ................ | 137/341 |
| 2004/0011985 A1 * | 1/2004 | Osawa et al. | .................... | 251/158 |
| 2007/0257220 A1 * | 11/2007 | Litscher et al. | ................. | 251/62 |
| 2008/0173842 A1 * | 7/2008 | Sakurai | ....................... | 251/335.3 |

* cited by examiner

*Primary Examiner* — John K Fristoe, Jr.
*Assistant Examiner* — Frederick D Soski
(74) *Attorney, Agent, or Firm* — Davis & Bujold, PLLC; Michael J. Bujold

(57) ABSTRACT

Provided is a valve for vacuum process, including: a first valve body having an inlet port and an outlet port; a sealing unit configured to move forward to and backward from the inlet port so as to have a closed position and an open position; a shaft covered with a bellows, and configured to move the sealing unit between the closed position and the open position; a cover for shielding the bellows from corrosive gas when the sealing unit is in the open position; and a cover guide unit configured to guide the cover to move along the shaft.

11 Claims, 4 Drawing Sheets

VALVE FOR VACUUM PROCESS

RELATED APPLICATIONS

Pursuant to 35 U.S.C. §119(a), this application claims the benefit of earlier filing date and right of priority to Korean Patent Application No. 10-2010-0115483, filed on Nov. 19, 2010, the contents of which are hereby incorporated by reference herein in their entirety.

BACKGROUND

1. Field

The following description relates to a valve for vacuum process that controls the degree of a vacuum according to stages in a semiconductor manufacturing process.

2. Description of the Related Art

Vacuum systems are used for manufacturing semiconductor devices. In chemical vapor deposition (CVD) systems, when energy is provided to gas in a chamber to get a plasma state, a reaction occurs in a wafer in the chamber and a thin film is formed on the wafer. Unnecessary reactants generated in the process are discharged through pumps and pipes.

These vacuum systems include valves for controlling the degree of the vacuum of pumps and pipes. Accordingly, foreign materials are deposited inside the valves due to corrosive gas which may reduce a life time of the device and even cause a serious problem to the pump.

SUMMARY

An object of an embodiment of the present invention is to provide a valve for vacuum process that minimizes deposition of foreign materials on valve components in an open state.

Another object of the embodiment of the present invention is to provide the valve for vacuum process that minimizes deflection of the shaft during a backward or forward motion.

To achieve these and other advantages in accordance with the purposes, there is provided a valve for vacuum process, including: a first valve body having an inlet port and an outlet port; a sealing unit configured to move forward to and backward from the inlet port so as to have a closed position and an open position; a shaft covered with a bellows, and configured to move the sealing unit between the closed position and the open position; a cover for shielding the bellows from corrosive gas when the sealing unit is in the open position; and a cover guide unit configured to guide the cover to move along the shaft.

The sealing unit may be coupled to one end of the cover, and the cover guide unit may be inserted to an opposite end of the cover.

The valve for vacuum process may further include: a second valve body coupled to the first valve body to support the shaft and the cover guide unit.

The cover guide unit may include: a guide member inserted into the opposite end of the cover; a first guide ring located in a front portion of the guide member to guide the cover when the cover moves along the shaft; and a first seal ring located in a rear portion of the guide member to seal the cover when the sealing unit is in the open position.

The front portion of the guide member may be coupled to the bellows, and the rear portion of the guide member may be coupled to an end flange of the first valve body.

The first guide ring may include a plurality of cutout portions along a circumferential direction thereof so as to discharge gas inside the cover when the sealing unit moves to the open position.

The cover may have a round chamfered edge to contact the first seal ring.

The valve for vacuum process may further include: a piston coupled to a rear end of the shaft so as to move the shaft by pneumatic pressure.

The valve for vacuum process may further include: a second guide ring installed on an outer circumferential surface of the piston to linearly guide the piston along a inner surface of the second valve body; and a second seal ring installed on the outer circumferential surface of the piston to seal the second valve body, wherein the inner surface of the second valve body has a cylindrical shape.

The second guide ring and the second seal ring may be spaced apart on the piston along a lengthwise direction of the shaft.

The cover may be coupled to the sealing unit by a plurality of screws, the screws being arranged in a radial direction along a periphery of the cover.

The bellows may include a plurality of sub plates welded one by one.

According to one embodiment, there is provided is a valve for vacuum process, including: a valve body having a valve room between an inlet port and an outlet port; a shaft assembly configured to have a closed position and an open position, the shaft assembly including: a shaft supported by the valve body to move forward to and backward from the inlet port; a sealing unit coupled to a front end of the shaft; a bellows covering the shaft; and a cover configured to shield the bellows while the bellows is deformed according to a position of the sealing unit; and a guide member installed in the valve room to guide the cover along a movement direction of the shaft.

Further scope of applicability of the valve for vacuum process will become apparent from the detailed description given hereinafter. However, it should be understood that the detailed description and specific examples, while indicating preferred embodiments of the invention, are given by illustration only, since various changes and modifications within the spirit and scope of the invention will become apparent to those skilled in the art from this detailed description.

DESCRIPTION OF SPECIFIC EMBODIMENTS

Hereinafter, a valve for vacuum process according to an exemplary embodiment will be described in detail with reference to accompanying drawings.

Figure 1:
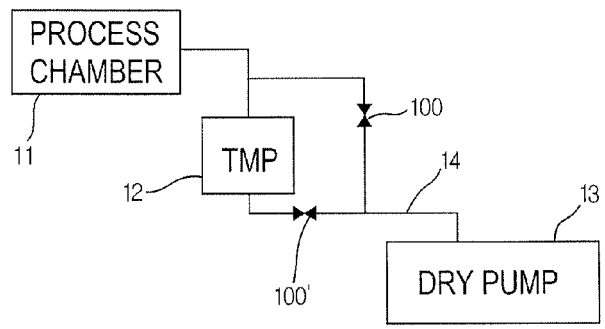
FIG. 1 is a schematic block diagram of a vacuum system that a valve for vacuum process according to an exemplary embodiment is used.

FIG. 1 is a schematic block diagram of a vacuum system that a valve for vacuum process according to an exemplary embodiment is used. FIG. 1 shows a process chamber 11, a turbo molecular pump (TMP) 12 and a dry pump 13.

When energy is provided to gas in a chamber to get a plasma state, a reaction occurs in a wafer in the chamber and a thin film is formed on the wafer. Unnecessary reactants generated in the thin film forming process are discharged through the turbo molecular pump 12 and a pipe 14. A first valve 100 for vacuum process is installed between the process chamber 11 and the dry pump 13. A second valve 100' for vacuum process is installed at a downstream of the turbo pump. The first valve for vacuum process 100 may be also called 'an isolation valve'. The second valve for vacuum process 100' disposed at the downstream of the turbo molecular pump 12 may be also called 'a turbo isolation valve'.

As an exemplary embodiment of FIG. 1, the valves for vacuum process 100, 100' may be applied to other devices such as a device for controlling the degree of a vacuum of a load lock chamber.

Figure 2:
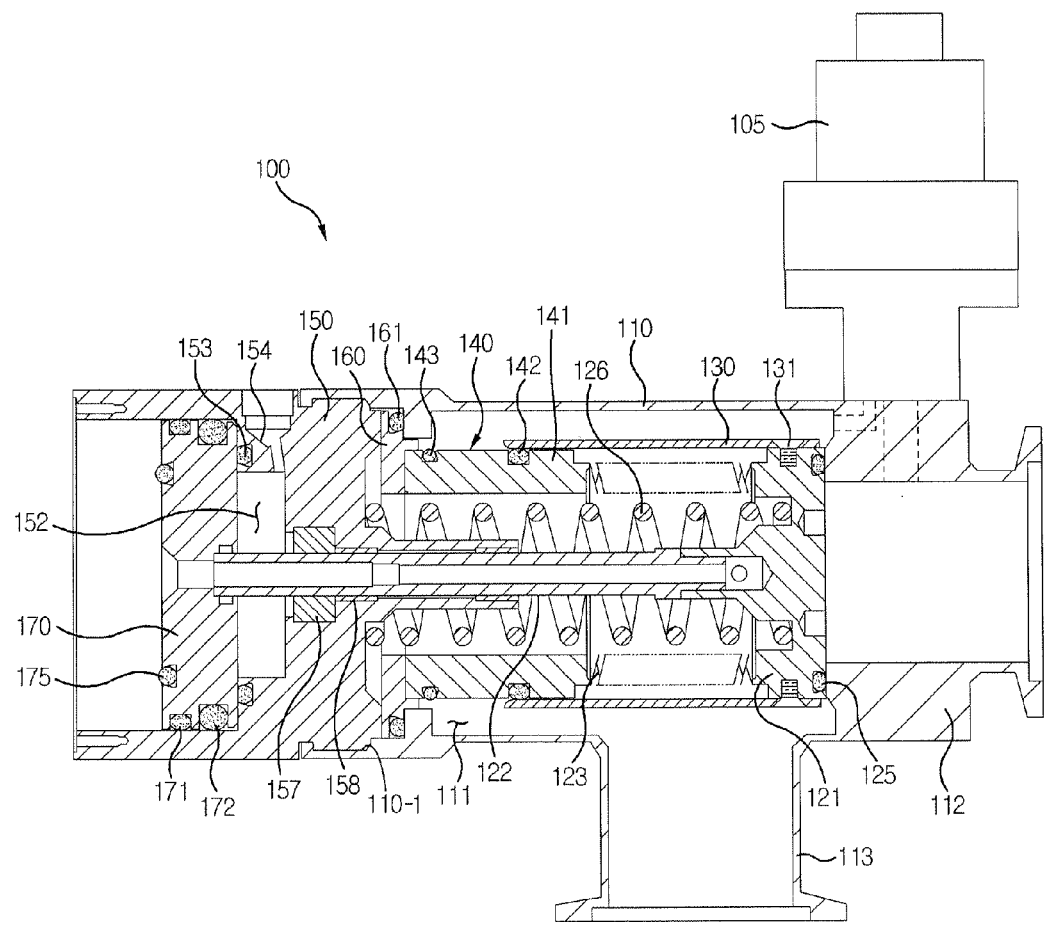
FIG. 2 is a cross-sectional view of a valve for vacuum process according to an exemplary embodiment.

FIG. 2 is a cross-sectional view of the valve for vacuum process according to an exemplary embodiment.

As shown in FIG. 2, the valve for vacuum process 100 includes a first valve body 110 having an inlet port 112 and an outlet port 113, and a mechanism for selectively opening or closing the inlet port 112. The opening and closing mechanism includes a shaft 122, a sealing unit 121, a bellows 123, a cover 130 and a cover guide unit 140.

The first valve body 110 has a valve room 111 inside. A shaft assembly 120 (see FIG. 3) is installed in the valve room 111. A coupling hole 110-1 is formed at an opposite side of the inlet port 112. A second valve body 150 for supporting the shaft 122 and the cover guide unit 140 is fastened to the coupling hole 110-1. The inlet port 112 is coupled to the chamber (not shown) and the outlet port 113 is coupled to the pump (not shown). The inlet port 112 and the outlet port 113 may be disposed to have different angles on the valve body 110. Referring to FIG. 2, the inlet port 112 and the outlet port 113 meet at right angles to each other.

The shaft 122 is extended out of the housing 150 to linearly move backward from or forward to the inlet port 112. A configuration of the second valve body 150 for supporting the shaft 122 will be described hereafter with reference to FIG. 5. A piston 170 is coupled to a rear portion of the shaft 122 to linearly move the shaft 122. A configuration of the piston 170 will be described in detail hereafter with reference to FIG. 6.

The sealing unit has a "closed position" and a "open position". In the closed position, the sealing unit 121 contacts the inlet port 112 to configure a closed state that the inlet port 112 is closed. In the open position, the sealing unit 121 is separated from the inlet port to configure an open state that the inlet port 112 is opened. An o-ring 125 that contacts the inlet port 112 to secure the inlet port 112 is provided on a front portion of the sealing unit 121.

The sealing unit 121 is coupled to a front portion of the shaft 122 and goes toward or goes back from the inlet port 112 by the shaft 122. The sealing unit 121 maintains a closed state due to elasticity by a spring 126 inserted into the shaft 122. The shaft 122 is forced to move back by pressure of the piston 170 provided on a rear portion of the shaft 122 to implement the open state of the sealing unit 121.

The shaft 122 is covered with the bellows 123 to protect the shaft 122 from corrosive gas when the inlet port 112 is open. The bellows 123 may be configured as 'a plate type bellows', which is molded by welding a plurality of sub plates. When contracted, the length of the plate type bellows is shorter than that of 'a molded bellows', which is molded by casting and has a form that has consecutive circular sections. The plate type bellows may present a wide space for installation and an enough distance between the open state and the closed state of the sealing unit 121, i.e., the distance enough to be relaxed to stroke of the sealing unit 121. Since the after-mentioned cover guide unit 140 reduces the length for installation of the bellows 123, the plate type bellows may be efficiently used.

An auxiliary port 105 may be provided in the valve body 110 to reduce a degree difference of a vacuum between the pipe connected to the inlet port 112 and the valve room 111 inside the valve 100 in a state that the inlet port 112 is closed. The auxiliary port 105 may be excluded in some vacuum systems.

Figure 3:
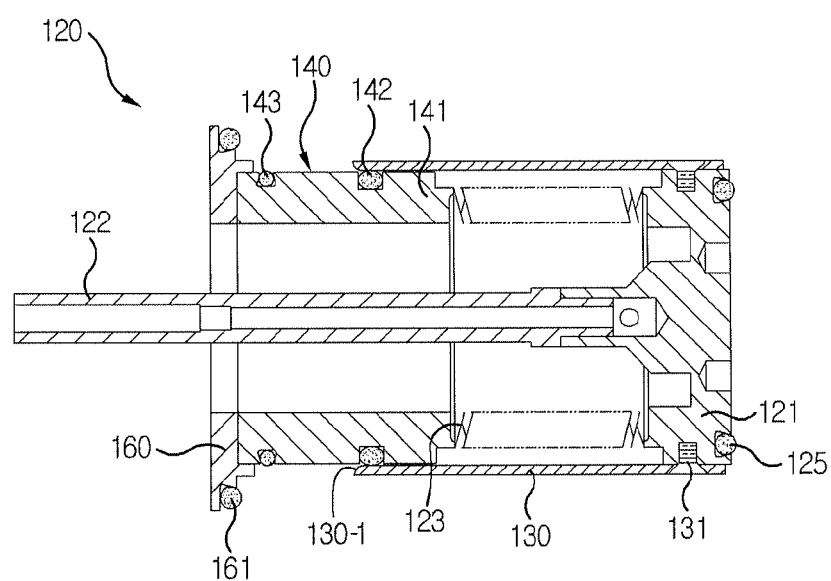
FIG. 3 is a cross-sectional view of a shaft assembly according to an exemplary embodiment.

FIG. 3 is a cross-sectional view showing that the cover is mounted on the shaft assembly.

The shaft assembly 120 includes the sealing unit 121, the shaft 122 and the bellows 123. One end of the shaft assembly 120 is supported by the first valve body 110 (may be understood as 'cantilever type'). The shaft 122 is extended out of the housing 150 to be guided by the second valve body 150. Since the second valve body 150 is fastened to the first valve body 110, the shaft assembly 120 is supported at one end of the first valve body 110.

As shown in FIG. 3, the bellows 123 is covered with the cover 130 to be protected from corrosive gas. Since the bellows 123 include a plurality of grooves, foreign materials in the corrosive gas easily gather. Accordingly, the bellows 123 is covered with the cover 130 having a smooth (simple) surface.

The cover 130 generally has a cylindrical shape and a front portion of the cover 130 is coupled to the sealing unit 121. The cover 130 is fastened to the sealing unit 121 by a plurality of screws 131, which are arranged in a radial direction along a periphery of the cover through an outer circumferential surface of the cover 130 in a state that the sealing unit 121 is inserted into the cover 130.

The cover 130 is supported by the cover guide unit 140 to increase a support power of the cover 130 and the cantilever shaft 122 of the shaft assembly 120 supported by the valve body 110 and to provide a rigid construction. The cover guide unit 140 prevents wobble while the cover 130 moves and shields the bellows 123 from gas flowing inside the valve room 111 when the sealing unit 121 is in the open position. The cover guide unit 140 includes a guide member 141, a first guide ring 142 provided at a first portion of the guide member 141, and a first seal ring 143 provided at a second portion of the guide member 141.

The guide member 141 has a cylindrical shape to cover the spring 126 and the shaft 122. The guide member 141 is installed in the valve room 111 along a central axis of the shaft 122. The guide member 141 is inserted to the cover 130 and makes the cover move along the guide member 141. The guide member 141 is also helpful for the shaft 122 to reduce deflection by gravity or other factors.

The first guide ring 142 contacts the inner surface of the cover 130 during relative movement between the guide member 141 and the cover 130 and guides the cover 130. A first distance between the first guide ring 142 and the first seal ring 143 may be set to be wider than that between the locations of the open position and the closed position so that the cover 130 can contact the first guide ring 142 at both locations of the open position and the closed position.

The first seal ring 143 contacts the end portion of the cover 130 when the sealing unit 121 reaches the open position. The end portion of the cover 130 includes a round chamfered edge 130-1 for tight contact with the first seal ring 143.

A front portion of the guide member 141 is coupled to the bellows 123. The rear portion of the guide member 141 disposed between the valve body 110 and the housing 150 is coupled to an end flange 160 for shielding the first valve body 110. An O-ring 161 is provided between the end flange 160 and the valve body 110 to improve sealing performance when the valve body 150 is fastened.

Figure 4:
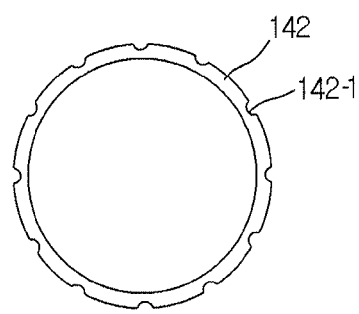
FIG. 4 is a front view of a first guide ring according to an exemplary embodiment.

FIG. 4 is a front view of a first guide ring according to an exemplary embodiment.

As shown in FIG. 4, a plurality of cutout portions 142-1 are formed on an outer circumferential surface of the first guide ring 142 along a circumferential direction. When the sealing unit 121 moves from the closed position to the open position, the cutout portion 142-1 reduces resistance such that air in the cover 130 escapes. Differently from FIG. 4, the cutout portion 142-1 may be located at one portion on an outer circumferential surface of the first guide ring 142.

Figure 5:
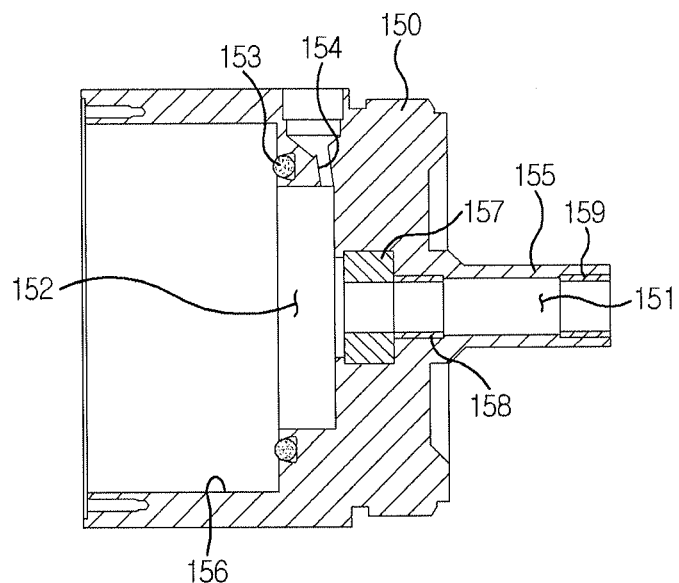
FIG. 5 is a cross-sectional view of a second valve body according to an exemplary embodiment.

FIG. 5 is a cross-sectional view of the second valve body according to an exemplary embodiment. The second valve body 150 includes a passage hole 151 into which the shaft 122 inserted. An O-ring 157 and bushings 158 and 159 for rotational support of the shaft 122 are included in the passage hole 151.

A cylinder portion 156 for guiding the piston 170 is formed on a rear portion of the second valve body 150. A port 154 for inflow of working fluid or gas is formed at one side of the second valve body 150. A fluid receiving portion 152 is provided at a middle portion of the second valve body 150 such that pressure of working fluid or gas is applied to the piston 170. A rubber ring 153 is provided on a bottom of the cylinder portion 156 to buffer the piston 170 in moving to the closed state.

Figure 6:
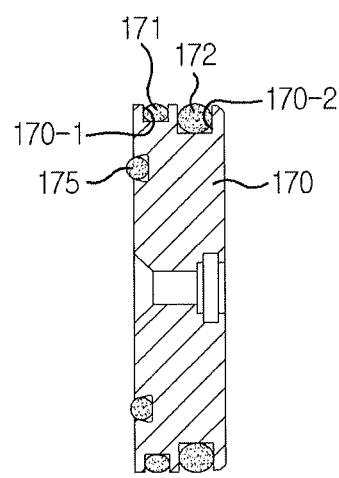
FIG. 6 is a cross-sectional view showing a piston according to an exemplary embodiment.

FIG. 6 is a cross-sectional view of the piston according to an exemplary embodiment. The piston 170 pulls the shaft 122 back by pressure of the working fluid or gas. The piston 170 has a wide width and forms a guide ring groove 170-2 for installing a second guide ring 172 and a seal ring groove 170-1 for installing a second seal ring 171 on an outer circumferential surface. The second guide ring 172 guides linear movement of the piston 170 inside the cylinder portion 156 to prevent deflection of the shaft 122 by radial load (e.g. gravity) due to pumping and eccentricity or eccentric abrasion of the piston 170.

Figure 7:
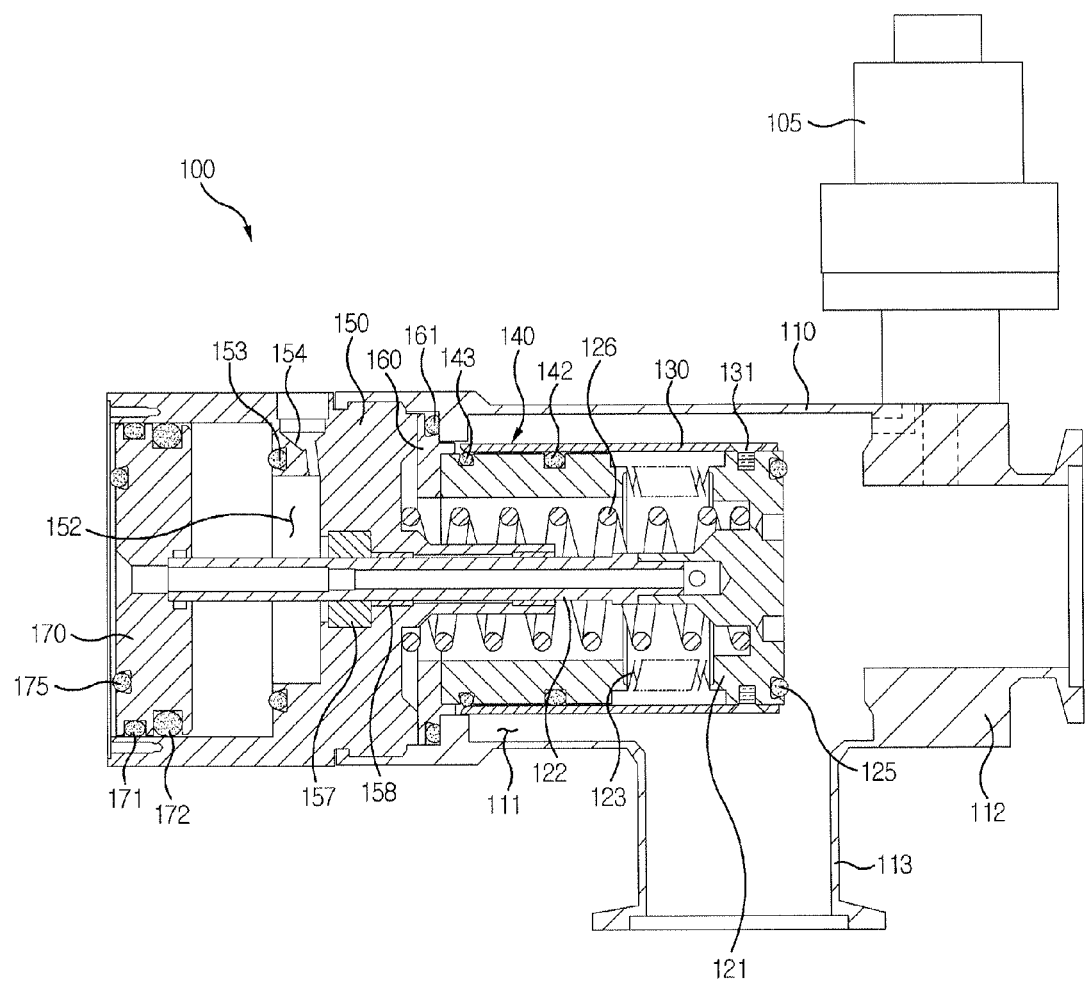
FIG. 7 is a cross-sectional view showing an open state of the valve for vacuum process of FIG. 2.

An operation by the above-mentioned configuration will be described hereinafter with reference to FIG. 7. FIG. 7 is a cross-sectional view of an open state of the valve for vacuum process of FIG. 2.

When working fluid is fed to the port 154, the piston 170 moves to the left side by pressure. Accordingly, the sealing unit 121 and the shaft 122 coupled to the piston 170 move to the left side while pressing the spring 126. When the sealing unit 121 for shielding the inlet port 112 is taken away from the inlet port 112, it starts to be opened.

At the same time, the cover 130 fastened to the sealing unit 121 moves to the left side according to guide of the guide member 141 and the first guide ring 142. A direction of the moving cover 130 corresponds to the direction of the moving piston 170 and the sealing unit 121. While the cover 130 moves, gas between the cover 130 and the bellows 123 is discharged to the valve room 111 through the cutout portion 142-1 formed on the first guide ring 142.

When the sealing unit 121 reaches a full open state, the end portion of the cover 130 contacts the first seal ring 143. Accordingly, it is prevented that corrosive gas and particles introduced inside the valve room 111 in the open state flow in the bellows 123.

In the valve for vacuum process according to an exemplary embodiment, it is possible to prevent by mounting the cover on the bellows that foreign substances are deposited on the bellows or that the bellows are damaged by deposition of the foreign substances. As a result, stability and durability of the device are improved and damage of the pump, etc. are reduced.

Also, the cover guide unit protects the shaft and the bellows from distortion by movement of the cover and allows structural stability in a back and forth motion.

It will be apparent to those skilled in the art that the valve for vacuum process described above is not limited to the configuration and the method according to the above-mentioned exemplary embodiment. All or the part of each exemplary embodiment may be configured to be selectively combined such that various changes and modifications are made without departing from the spirit and scope of the invention as defined in the following claims.

What is claimed is:

1. A valve for vacuum process, comprising:
   a first valve body having an inlet port and an outlet port;
   a sealing unit configured to move forward to and backward from the inlet port so as to have a closed position and an open position;
   a shaft covered with a bellows, and configured to move the sealing unit between the closed position and the open position;
   a cover for shielding the bellows from corrosive gas when the sealing unit is in the open position; and
   a cover guide unit configured to guide the cover axially parallel to the shaft; the sealing unit is coupled to one end of the cover, and the cover guide unit is inserted into an opposite end of the cover; a second valve body coupled to the first valve body to support the shaft and the cover guide unit; and the cover guide unit comprises a guide member inserted into the opposite end of the cover.

2. The valve for vacuum process of claim 1,
   wherein the cover guide unit comprises:
   a first guide ring located in a front portion of the guide member to guide the cover when the cover moves along the shaft; and
   a first seal ring located in a rear portion of the guide member to seal the cover when the sealing unit is in the open position.

3. The valve for vacuum process of claim 2,
   wherein the front portion of the guide member is coupled to the bellows, and the rear portion of the guide member is coupled to an end flange of the first valve body.

4. The valve for vacuum process of claim 3,
   wherein the first guide ring includes a plurality of cutout portions along a circumferential direction thereof so as to discharge gas inside the cover when the sealing unit moves to the open position.

5. The valve for vacuum process of claim 2,
   wherein the cover has a round chamfered edge to contact the first seal ring.

6. The valve for vacuum process of claim 3, further comprising:
   a piston coupled to a rear end of the shaft so as to move the shaft by pneumatic pressure.

7. The valve for vacuum process of claim 6, further comprising:
   a second guide ring installed on an outer circumferential surface of the piston to linearly guide the piston along a inner surface of the second valve body; and
   a second seal ring installed on the outer circumferential surface of the piston to seal the second valve body,
   wherein the inner surface of the second valve body has a cylindrical shape.

8. The valve for vacuum process of claim 7,
wherein the second guide ring and the second seal ring are spaced apart on the piston along a lengthwise direction of the shaft.
9. The valve for vacuum process of claim 1,
wherein the cover is coupled to the sealing unit by a plurality of screws, the screws being arranged in a radial direction along a periphery of the cover.
10. The valve for vacuum process of claim 1,
wherein the bellows includes a plurality of sub plates welded one by one.
11. A valve for vacuum process, comprising:
a first valve body having a valve room between an inlet port and an outlet port;
a shaft assembly configured to have a closed position and an open position,
  the shaft assembly, including:
    a shaft supported by the first valve body to move forward to and backward from the inlet port;
    a sealing unit coupled to a front end of the shaft;
    a bellows covering the shaft; and
    a cover configured to shield the bellows while the bellows is deformed according to a position of the sealing unit; and
a cover guide unit installed in the valve room to guide the cover axially parallel to the shaft; the sealing unit is coupled to one end of the cover, and the cover guide unit is inserted into an opposite end of the cover; a second valve body coupled to the first valve body to support the shaft and the cover guide unit; and the cover guide unit comprises a guide member inserted into the opposite end of the cover.

* * * * *